(12) United States Patent
Xue et al.

(10) Patent No.: US 12,127,447 B2
(45) Date of Patent: Oct. 22, 2024

(54) DISPLAY SUBSTRATE AND PREPARATION METHOD THEREOF, AND DISPLAY APPARATUS

(71) Applicant: BOE Technology Group Co., Ltd., Beijing (CN)

(72) Inventors: Dapeng Xue, Beijing (CN); Shuilang Dong, Beijing (CN); Ke Wang, Beijing (CN); Zhanfeng Cao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 192 days.

(21) Appl. No.: 17/502,052

(22) Filed: Oct. 15, 2021

(65) Prior Publication Data
US 2022/0302234 A1 Sep. 22, 2022

(30) Foreign Application Priority Data

Mar. 16, 2021 (CN) .......................... 202110281712.5

(51) Int. Cl.
*H01L 51/52* (2006.01)
*H01L 25/075* (2006.01)
*H01L 25/16* (2023.01)
*H01L 51/56* (2006.01)
*H10K 50/858* (2023.01)
*H10K 59/124* (2023.01)
(Continued)

(52) U.S. Cl.
CPC ....... *H10K 59/124* (2023.02); *H01L 25/0753* (2013.01); *H01L 25/167* (2013.01); *H10K 50/858* (2023.02); *H10K 59/879* (2023.02); *H10K 71/00* (2023.02); *H01L 33/44* (2013.01)

(58) Field of Classification Search
CPC .. H10K 59/124; H10K 59/875; H10K 59/879; H10K 50/585; H10K 50/85
See application file for complete search history.

(56) References Cited

U.S. PATENT DOCUMENTS

2016/0099296 A1* 4/2016 Jeon .................. H10K 50/858
257/40
2017/0005155 A1* 1/2017 You .................. H10K 59/124
(Continued)

FOREIGN PATENT DOCUMENTS

CN 104867958 A 8/2015
CN 106328673 A 1/2017
(Continued)

OTHER PUBLICATIONS

Office Action dated Jun. 28, 2024 for Chinese Patent Application No. 2021102817125 and English Translation.

*Primary Examiner* — Victoria K. Hall
(74) *Attorney, Agent, or Firm* — Ling Wu; Stephen Yang; Ling and Yang Intellectual Property

(57) ABSTRACT

A display substrate is provided, which includes a base substrate and a plurality of sub-pixels disposed on the base substrate. At least one sub-pixel includes a light transmittance region and a display region. The display region includes a circuit structure layer and a light-emitting element which are disposed on a base substrate, and the light-emitting element is connected with the circuit structure layer. The display substrate further includes a plurality of insulating layers disposed on the base substrate, and at least one insulating layer is hollowed out in the light transmittance region.

14 Claims, 6 Drawing Sheets

(51) Int. Cl.
    *H10K 59/80*     (2023.01)
    *H10K 71/00*     (2023.01)
    *H01L 33/44*     (2010.01)

(56) References Cited

U.S. PATENT DOCUMENTS

| | | | |
|---|---|---|---|
| 2017/0040396 A1* | 2/2017 | Li | H10K 50/824 |
| 2017/0186824 A1* | 6/2017 | Lee | H10K 59/88 |
| 2018/0145118 A1* | 5/2018 | Kim | H10K 59/122 |
| 2019/0363290 A1* | 11/2019 | Watanabe | H10K 59/8731 |
| 2020/0365664 A1* | 11/2020 | Jeon | H10K 71/00 |
| 2021/0066648 A1* | 3/2021 | Chung | H10K 50/865 |
| 2021/0313539 A1* | 10/2021 | Jeon | H10K 59/122 |
| 2022/0029138 A1* | 1/2022 | Wang | H10K 50/865 |
| 2022/0059633 A1* | 2/2022 | Kang | H10K 59/1216 |
| 2022/0302234 A1* | 9/2022 | Xue | H01L 25/0753 |
| 2024/0099079 A1* | 3/2024 | Li | H10K 59/124 |

FOREIGN PATENT DOCUMENTS

| | | |
|---|---|---|
| CN | 110634937 A | 12/2019 |
| CN | 111696444 A | 9/2020 |

\* cited by examiner

DISPLAY SUBSTRATE AND PREPARATION METHOD THEREOF, AND DISPLAY APPARATUS

CROSS-REFERENCE TO RELATED APPLICATION

The present application claims the priority of Chinese Patent Application No. 202110281712.5 filed to the CNIPA on Mar. 16, 2021, the content of which is incorporated herein by reference.

TECHNICAL FIELD

Embodiments of the present disclosure relate to, but are not limited to, the field of display technology, in particular to a display substrate and a preparation method thereof, and a display apparatus.

BACKGROUND

A transparent display refers to a display with a certain degree of light penetrability, which allows people to not only see what is displayed on the display, but also the situation behind it. Currently, transparent displays have been widely used in showcases, transparent televisions, vehicle-mounted system, Virtual Reality (VR), Augmented Reality (AR) and other fields.

SUMMARY

The following is a summary of the subject matter detailed herein. This summary is not intended to limit the protection scope of the claims.

Embodiments of the present disclosure provide a display substrate and a manufacturing method thereof, and a display apparatus.

In one aspect, an embodiment of the disclosure provides a display substrate, including: a base substrate and a plurality of sub-pixels disposed on the base substrate. At least one sub-pixel includes a light transmittance region and a display region. The display region includes a circuit structure layer and a light-emitting element which are disposed on a base substrate, and the light-emitting element is connected with the circuit structure layer. The display substrate further includes a plurality of insulating layers disposed on the base substrate, and at least one insulating layer is hollowed out in the light transmittance region.

In some exemplary embodiments, the plurality of insulating layers include at least one organic insulating layer and a plurality of inorganic insulating layers; at least one organic insulating layer is hollowed out in the light transmittance region, or at least one inorganic insulating layer is hollowed out in the light transmittance region.

In some exemplary embodiments, the light transmittance region is provided with a plurality of insulating layers, and an absolute value of a refractive index difference between adjacent insulating layers in the plurality of insulating layers is less than or equal to 0.5.

In some exemplary embodiments, the display region further includes at least one of a first anti-reflection layer located on a side of the circuit structure layer close to the base substrate and a second anti-reflection layer located on a side of the circuit structure layer away from the base substrate.

In some exemplary embodiments, the circuit structure layer includes a first conductive layer, a semiconductor layer, a second conductive layer, a third conductive layer, a fourth conductive layer and a fifth conductive layer disposed on the base substrate. The plurality of insulating layers include: a first insulating layer between the base substrate and the first conductive layer, a second insulating layer between the first conductive layer and the semiconductor layer, a third insulating layer between the semiconductor layer and the second conductive layer, a fourth insulating layer between the second and third conductive layers, a fifth insulating layer between the third and fourth conductive layers, a sixth and a seventh insulating layers between the fourth and fifth conductive layers, and an eighth and a ninth insulating layer located between the fifth conductive layer and the second anti-reflection layer. Wherein, the first insulating layer to fifth insulating layer, the seventh insulating layer and the eighth insulating layer are inorganic insulating layers, and the sixth insulating layer and the ninth insulating layer are organic insulating layers.

In some exemplary embodiments, the first anti-reflection layer and the first conductive layer are integrated.

In some exemplary embodiments, an orthographic projection of the first anti-reflection layer on the base substrate at least includes an orthographic projection of the fifth conductive layer on the base substrate.

In some exemplary embodiments, the reflectivity of the surface of the first anti-reflection layer facing the base substrate is at least lower than the reflectivity of the surface of the fifth conductive layer facing the base substrate.

In some exemplary embodiments, the reflectivity of the material of the first anti-reflection layer is smaller than the reflectivity of the material of the fifth conductive layer.

In some exemplary embodiments, an orthographic projection of the second anti-reflection layer on the base substrate includes a region in the display region outside the overlapping region of the light-emitting element and the fifth conductive layer on the base substrate.

In some exemplary embodiments, the first insulating layer has a stacked structure of SiNx and SiOx, the second insulating layer is made of SiOx, the third insulating layer has a stacked structure of SiOx and SiNx, the fourth insulating layer is made of SiNx, the fifth insulating layer has a stacked structure of SiOx and SiNx, and the seventh and eighth insulating layers are made of SiNx. Alternatively, the first insulating layer is made of SiOx, the second insulating layer is made of SiOx, the third insulating layer has a stacked structure of SiOx and SiNx, the fourth insulating layer is made of SiNx, the fifth insulating layer is made of SiNx, and the seventh and eighth insulating layers are made of SiNx.

In some exemplary embodiments, the first insulating layer and the fifth insulating layer are hollowed out in the light transmittance region; or, the first insulating layer to the ninth insulating layer are hollowed out in the light transmittance region; or, the sixth insulating layer and the ninth insulating layer are hollowed out in the light transmittance region; or, only the sixth insulating layer and the ninth insulating layer are disposed in the light transmittance region.

In some exemplary embodiments, the display substrate further includes an anti-reflective layer located on one side of the base substrate away from the sub-pixel; an orthographic projection of the anti-reflective layer on the base substrate covers the light transmittance region and the display region.

In another aspect, an embodiment of the present disclosure provides a display apparatus, which includes the display substrate described above.

In another aspect, an embodiment of the present disclosure provides a preparation method for a display substrate, which is used for preparing the aforementioned display substrate, the method includes: forming a plurality of sub-pixels on a base substrate, at least one sub-pixel includes a light transmittance region and a display region; the display region includes a circuit structure layer and a light-emitting element which are disposed on a base substrate, and the light-emitting element is connected with the circuit structure layer; the display region is further provided with a plurality of insulating layers, and at least one insulating layer is hollowed out in the light transmittance region.

In some exemplary embodiments, forming a plurality of sub-pixels on the base substrate includes sequentially forming a first insulating layer, a first conductive layer, a second insulating layer, a semiconductor layer, a third insulating layer, a second conductive layer, a fourth insulating layer, a third conductive layer, a fifth insulating layer, a fourth conductive layer, a sixth insulating layer, a seventh insulating layer, a fifth conductive layer, an eight insulating layer and a ninth insulating layer on the base substrate, wherein, the semiconductor layer, the first conductive layer, the second conductive layer, the third conductive layer, the fourth conductive layer and the fifth conductive layer are located in the display region, and the sixth insulating layer and the ninth insulating layer are hollowed out in the light transmittance region.

In some exemplary embodiments, forming a plurality of sub-pixels on the base substrate further includes removing the first insulating layer of the light transmittance region before forming the second insulating layer; and removing the fifth insulating layer of the light transmittance region before forming the sixth insulating layer.

In some exemplary embodiments, forming a plurality of sub-pixels on the base substrate further includes removing the first insulating layer to fifth insulating layer, the seventh insulating layer and the eighth insulating layer in the light transmittance region after forming the eighth insulating layer or after forming the ninth insulating layer.

In some exemplary embodiments, forming a plurality of sub-pixels on the base substrate includes sequentially forming a first insulating layer, a first conductive layer, a second insulating layer, a semiconductor layer, a third insulating layer, a second conductive layer, a fourth insulating layer, a third conductive layer, a fifth insulating layer, a fourth conductive layer, a sixth insulating layer, a seventh insulating layer, a fifth conductive layer, an eight insulating layer and a ninth insulating layer on the base substrate. Wherein, the semiconductor layer, the first conductive layer, the second conductive layer, the third conductive layer, the fourth conductive layer and the fifth conductive layer are located in the display region. The first insulating layer to fifth insulating layer of the light transmittance region are removed before forming the sixth insulating layer, and the seventh and eighth insulating layers of the light transmittance region are removed before forming the ninth insulating layer.

Other aspects will become apparent upon reading and understanding accompanying drawings and the detailed description.

BRIEF DESCRIPTION OF DRAWINGS

Accompanying drawings are used to provide a further understanding of technical solutions of the present disclosure and constitute a part of the description to explain the technical solutions of the present disclosure together with embodiments of the present disclosure, and do not constitute any limitation on the technical solutions of the present disclosure. Shapes and sizes of one or more components in the accompanying drawings do not reflect real scales, and are only for a purpose of schematically illustrating contents of the present disclosure.

DETAILED DESCRIPTION

Figure 1:
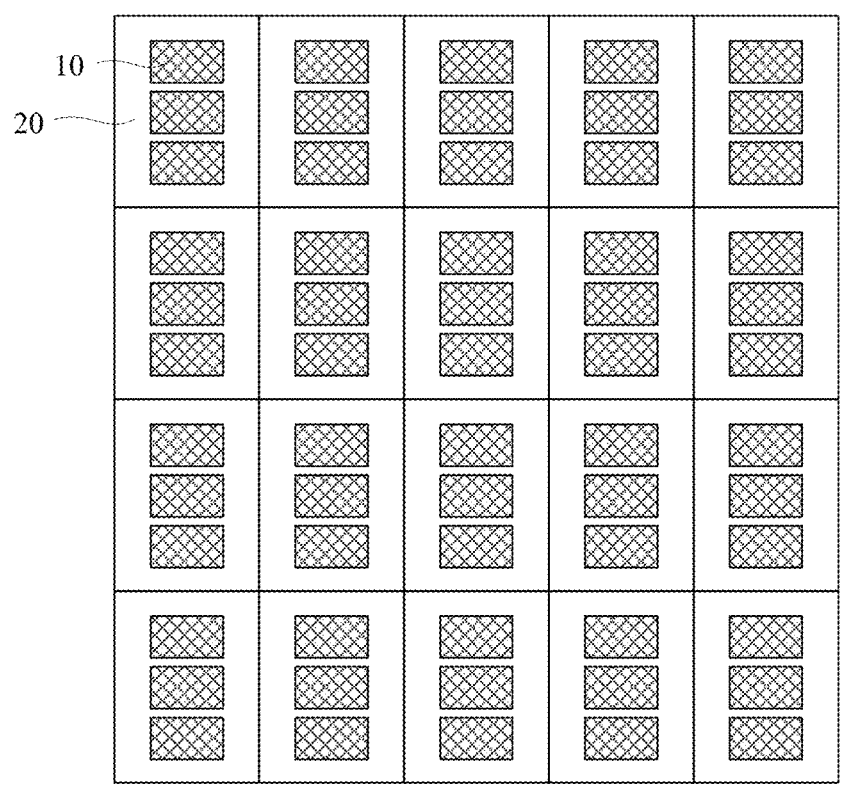
FIG. 1 is a schematic plan view of a display substrate according to at least one embodiment of the present disclosure.

Hereinafter embodiments of the present disclosure will be described in detail with reference to the accompanying drawings. The embodiments may be implemented in a plurality of different forms. Those of ordinary skills in the art will readily understand a fact that implementations and contents may be transformed into one or more of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, a size of one or more constituent elements, or a thickness or a region of a layer, is sometimes exaggerated for clarity. Therefore, an implementation of the present disclosure is not necessarily limited to the size shown, and a shape and size of each component in the drawings do not reflect true proportions. In addition, the drawings schematically show ideal examples, and an implementation of the present disclosure is not limited to the shapes or values shown in the drawings.

The "first", "second", "third" and other ordinal numbers in the present disclosure are used to avoid confusion of constituent elements, not to provide any quantitative limitation. In the description of the present disclosure, "a plurality of" means two or more than two.

In the present disclosure, for the sake of convenience, wordings such as "central", "upper", "lower", "front", "rear", "vertical", "horizontal", "top", "bottom", "inner", "outer" and the others describing orientations or positional relations are used to depict positional relations of constituent elements with reference to the drawings, which are only for convenience of describing the specification and simplifying the description, rather than indicating or implying that the device or element referred to must have a specific orientation, or must be constructed and operated in a particular orientation and therefore, those wordings cannot be construed as limitations on the present disclosure. The positional relations of the constituent elements may be appropriately changed according to a direction in which constituent elements are described. Therefore, it is not limited to the wordings described in the specification, and they may be replaced appropriately according to a situation.

In the present disclosure, the terms "installed", "connected", and "coupled" shall be understood in their broadest sense unless otherwise explicitly specified and defined. For example, a connection may be a fixed connection, or a detachable connection, or an integrated connection; it may be a mechanical connection, or an electrical connection; it may be a direct connection, or an indirect connection through middleware, or an internal connection between two elements. Those of ordinary skills in the art may understand meanings of the above terms in the present disclosure according to a situation.

In the present disclosure, a transistor refers to an element including at least three terminals, namely, a gate electrode, a drain electrode, and a source electrode. The transistor has a channel region between the drain electrode (drain electrode terminal, drain region, or drain electrode) and the source electrode (source electrode terminal, source region, or source electrode), and a current can flow through the drain electrode, the channel region, and the source electrode. In the present disclosure, the channel region refers to a region through which the current mainly flows. Functions of the "source electrode" and the "drain electrode" are sometimes interchangeable in a case where transistors with opposite polarities are used or in a case where a direction of a current changes during circuit operation. Therefore, in the present disclosure, the "source electrode" and the "drain electrode" are interchangeable.

In the present disclosure, "an electrical connection" includes a case where constituent elements are connected via an element having an electrical function. As long as electrical signals between the connected constituent elements can be transmitted and received, there is no special limitation to "component having a certain electrical action". Examples of the "element having a certain electrical action" not only include electrodes and wirings, but also include switch elements (such as transistors), resistors, inductors, capacitors, and other elements with one or more functions.

In the present disclosure, "parallel" refers to a state in which an angle formed by two straight lines is above −10 degrees and below 10 degrees, and thus may include a state in which the angle is above −5 degrees and below 5 degrees. In addition, "perpendicular" refers to a state in which an angle formed by two straight lines is above 80 degrees and below 100 degrees, and thus may include a state in which the angle is above 85 degrees and below 95 degrees.

In the present disclosure, "film" and "layer" are interchangeable. For example, sometimes a "conductive layer" may be replaced by a "conductive film". Similarly, an "insulating film" may sometimes be replaced by an "insulating layer".

"About" and "approximately" in the present disclosure means that limits of a value are not limited strictly, and the value is within a range of process and measurement errors.

In this disclosure, "thickness" and "height" refer to the vertical distance between the surface of a side of the film layer away from the base substrate and the surface of a side of the film layer close to the base substrate.

At least one embodiment of the present disclosure provides a display substrate, including a base substrate and a plurality of sub-pixels disposed on the base substrate. At least one sub-pixel includes a light transmittance region and a display region. The display region includes a circuit structure layer and a light-emitting element which are disposed on the base substrate. The light-emitting element is connected with the circuit structure layer. The display substrate further includes a plurality of insulating layers disposed on the base substrate, wherein at least one insulating layer is hollowed out in the light transmittance region. The display substrate provided by this embodiment has higher display transmittance and display quality.

In some exemplary embodiments, a light-emitting element may be a micro light-emitting element such as a Micro Light-Emitting Diode (Micro-LED) or a Mini Light-Emitting Diode (Mini-LED). Micro-LED technology, namely Light-Emitting Diode (LED) miniaturization and Matriculated technology, refers to the integration of high-density and small-sized LED arrays on one chip. Among them, each LED may be addressed and driven individually for lighting up, which may reduce the pixel distance between two adjacent LEDs from millimeter level to micron level and thereby improving the display effect. Micro-LED has the display characteristics of self-luminous, with the advantages of all-solid-state, long life, high brightness, low power consumption, small size, ultra-high resolution, and may be applied to extreme environments such as high temperature or radiation. Micro light-emitting elements are adopted in this exemplary embodiment to prolong the service life of the display substrate and achieve better display quality.

In some exemplary embodiments, a plurality of insulating layers include at least one organic insulating layer and a plurality of inorganic insulating layers. At least one organic insulating layer is hollowed out in a light transmittance region, or at least one inorganic insulating layer is hollowed out in the light transmittance region. In some examples, an inorganic insulating layer is disposed in the light transmittance region, and all organic insulating layers are hollowed out in the light transmittance region; or, an organic insulating layer is disposed in the light transmittance region, and all inorganic insulating layers are hollowed out in the light transmittance region. In this example, an orthographic projection of at least one insulating layer on the base substrate does not overlap with the light transmittance region. However, this is not limited in the embodiment. In this exemplary embodiment, hollowing out at least a part of the insulating layer in the light transmittance region can improve the transmittance of the light transmittance region.

In some exemplary embodiments, a light transmittance region is provided with a plurality of insulating layers, and an absolute value of a refractive index difference between adjacent insulating layers in the plurality of insulating layers is less than or equal to 0.5. In this exemplary embodiment, setting the refractive index of the insulating layers in the light transmittance region to be equal or matched helps to improve the transmittance of the light transmittance region.

In some exemplary embodiments, a display region further includes at least one of a first anti-reflection layer located on a side of a circuit structure layer close to a base substrate and a second anti-reflection layer located on a side of the circuit structure layer away from the base substrate. For example, only the first anti-reflection layer or the second anti-reflection layer may be provided in the display region, or two anti-reflection layers may be used in the display region. However, this is not limited in the embodiment. In this exemplary embodiment, providing anti-reflection layers in the display region can prevent the reflection effect of the metal in the circuit structure layer, and thereby improving the display effect.

In some exemplary embodiments, a circuit structure layer includes a first conductive layer, a semiconductor layer, a second conductive layer, a third conductive layer, a fourth conductive layer and a fifth conductive layer which are sequentially disposed on a base substrate. A plurality of insulating layers include: a first insulating layer between the base substrate and the first conductive layer, a second insulating layer between the first conductive layer and the semiconductor layer, a third insulating layer between the semiconductor layer and the second conductive layer, a fourth insulating layer between the second conductive layer and third conductive layer, a fifth insulating layer between the third conductive layer and fourth conductive layer, a sixth insulating layer and a seventh insulating layer between the fourth and fifth conductive layers, and an eighth insulating layer and a ninth insulating layer located between the fifth conductive layer and the second anti-reflection layer, wherein, the first insulating layer to the fifth insulating layer, the seventh insulating layer and the eighth insulating layer are inorganic insulating layers, and the sixth insulating layer and the ninth insulating layer are organic insulating layers. In this exemplary embodiment, the transistors in a light-emitting driving circuit included in a circuit structure layer may be double-gate transistors. However, this is not limited in the embodiment. For example, the transistors in the light-emitting driving circuit may have a single-gate structure.

In some exemplary embodiments, the first anti-reflection layer and the first conductive layer are integrated. However, this is not limited in the embodiment. For example, the first anti-reflection layer may be located on one side of the first conductive layer close to the base substrate.

In some exemplary embodiments, an orthographic projection of a first anti-reflection layer on a base substrate at least includes an orthographic projection of a fifth conductive layer on the base substrate. In some examples, the fifth conductive layer may be made of metallic copper (Cu). The exemplary embodiment may avoid the reflection effect of the fifth conductive layer, thereby improving the display effect. However, this is not limited in the embodiment. For example, the orthographic projection of the first anti-reflection layer on the base substrate includes the orthographic projections of the first conductive layer to the fifth conductive layer on the base substrate.

In some exemplary embodiments, the reflectivity of a surface of a first anti-reflection layer facing the base substrate is at least lower than the reflectivity of a surface of a fifth conductive layer facing the base substrate. The exemplary embodiment may achieve the anti-reflection effect of one side close to the base substrate. However, this is not limited in the embodiment. For example, the reflectivity of the surface of the first anti-reflection layer facing the base substrate may be lower than that of the surfaces of the first conductive layer to fifth conductive layer facing the base substrate.

In some exemplary embodiments, the reflectivity of the material of a first anti-reflection layer is smaller than the reflectivity of the material of a fifth conductive layer. In this exemplary embodiment, the first anti-reflection layer may effectively achieve the anti-reflection effect on the fifth conductive layer by using a material with lower reflectivity, thereby improving the display effect. In addition, the first anti-reflection layer of this exemplary embodiment is easy to implement because there is no need to add surface treatment process. However, this is not limited in the embodiment. For example, the reflectivity of the material of the first anti-reflection layer is smaller than the reflectivity of the materials of the first conductive layer to fifth conductive layer.

In some exemplary embodiments, an orthographic projection of a second anti-reflection layer on a base substrate includes a region in the display region outside the overlapping region of the light-emitting element and the fifth conductive layer on the base substrate. The second anti-reflection layer in this exemplary embodiment may prevent the reflection effect of the fifth conductive layer, and may prevent light color mixing between adjacent light-emitting elements, thereby improving the display effect.

In some exemplary embodiments, a first insulating layer has a stacked structure of Silicon Nitride (SiNx) and Silicon Oxide (SiOx), the second insulating layer is made of SiOx, the third insulating layer has a stacked structure of SiOx and SiNx, the fourth insulating layer is made of SiNx, the fifth insulating layer has a stacked structure of SiOx and SiNx, and the seventh insulating layer and eighth insulating layer are made of SiNx. Alternatively, the first insulating layer is made of SiOx, the second insulating layer is made of SiOx, the third insulating layer has a stacked structure of SiOx and SiNx, the fourth insulating layer is made of SiNx, the fifth insulating layer is made of SiNx, and the seventh insulating layer and eighth insulating layer are made of SiNx. However, this is not limited in the embodiment.

The solution according to this embodiment will be illustrated below through a number of examples.

FIG. 1 is a schematic plan view of a display substrate according to at least one embodiment of the present disclosure. In an exemplary embodiment, as shown in FIG. 1, the display substrate includes a base substrate and a plurality of sub-pixels disposed on the base substrate. At least one sub-pixel includes a light transmittance region 20 and a display region 10, wherein, the ambient light may pass through the light transmittance region 20, but may not pass through the display region 10. The areas of the light transmittance region 20 and the display region 10 in the sub-pixel are not limited in this embodiment. In some examples, the area of the light transmittance region 20 in the sub-pixel may be larger than the area of the display region 10. For example, the area of the light transmittance region 20 in the sub-pixel may be 1 to 3 times, such as 1.5 times, the area of the display region 10. The larger the area of the light transmittance region 20, the greater the transmittance of the display substrate, and the clearer the image may be seen through the display substrate. In some examples, the total area of the light transmittance region 20 of the display substrate may account for more than 45% of the total area of the display substrate, for example, it may be about 48.5%, 79.3%, 82.1% or 85%. However, this is not limited in the embodiment. In some examples, the area ratio of the light transmittance region may be set according to practical requirements.

Figure 2:
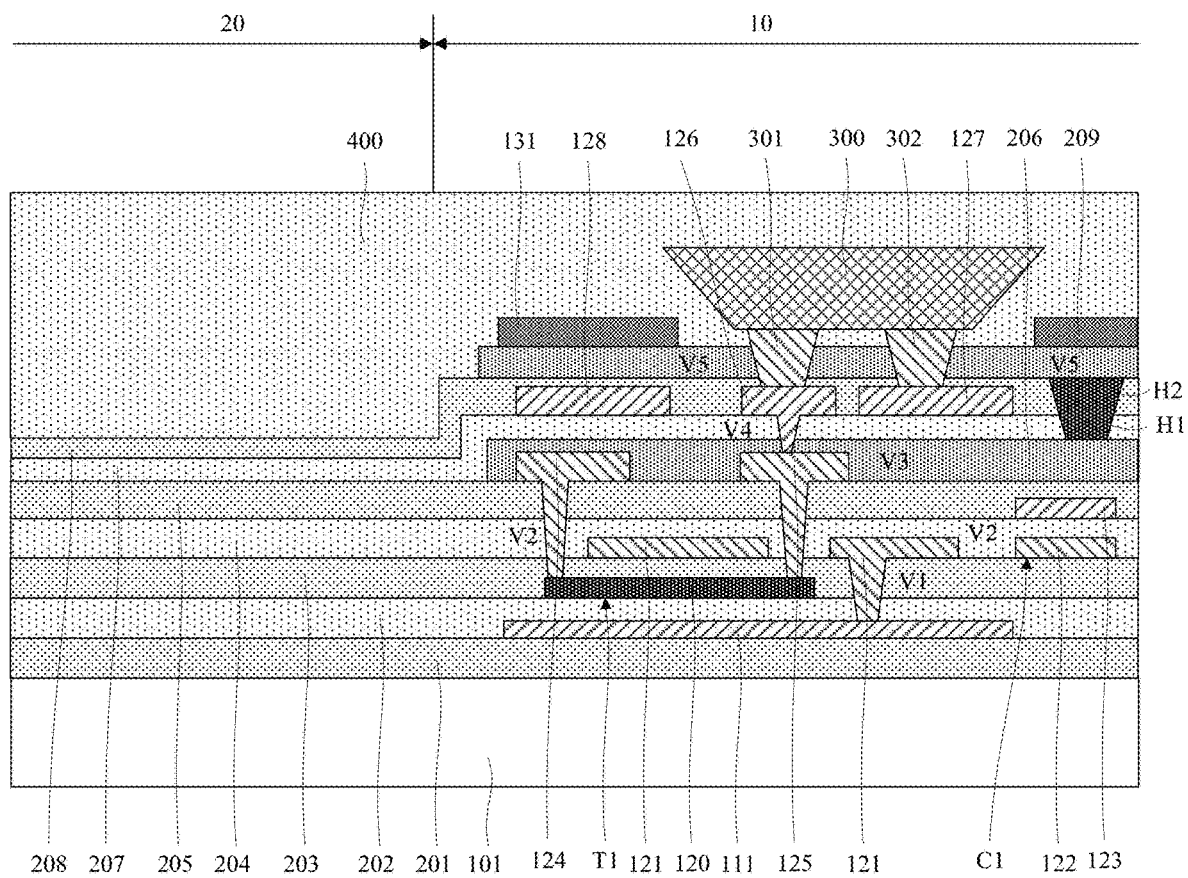
FIG. 2 is a schematic diagram of a structure of a display substrate according to at least one embodiment of the present disclosure.

FIG. 2 is a schematic diagram of a structure of a display substrate according to at least one embodiment of the present disclosure. FIG. 2 shows the sectional structure of a sub-pixel. In some exemplary embodiments, as shown in FIG. 2, in a direction perpendicular to the display substrate, the display region 10 includes a first anti-reflection layer, a circuit structure layer, a second anti-reflection layer, light-emitting elements and a capping layer 400 disposed on a base substrate 101. In this example, the light-emitting element is a micro light-emitting element, such as a Micro-LED. The circuit structure layer at least includes a light-emitting driving circuit. The light-emitting driving circuit is connected with the micro light-emitting element. A first light-emitting drive circuit may include a plurality of transistors and at least one capacitor. For example, the light-emitting drive circuit may be designed as 8T2C (i.e., eight transistors and two capacitors) or 13T1C (i.e., thirteen transistors and one capacitor). In FIG. 2, one first transistor T1 and one first capacitor C1 are illustrated as an example. A circuit structure layer of the display region 10 includes a first conductive layer, a semiconductor layer, a second conductive layer, a third conductive layer, a fourth conductive layer and a fifth conductive layer which are sequentially disposed on a base substrate 101. The semiconductor layer at least includes a first active layer 120. The first conductive layer at least includes a first gate electrode 111. The second conductive layer at least includes a second gate electrode 121 and a first capacitor electrode 122. The third conductive layer at least includes a second capacitor electrode 123. The fourth conductive layer at least includes a first source electrode 124 and a first drain electrode 125. The fifth conductive layer at least includes a connection electrode 126, a common electrode line 127, and a signal line 128 (for example, a power supply line VDD). The first active layer 120, the first gate electrode 111, the second gate electrode 121, the first source electrode 124 and the first drain electrode 125 form a first transistor T1, and the first capacitor electrode 122 and the second capacitor electrode 123 form a first capacitor C1. In this example, the first transistor T1 is a double-gate transistor, and the first gate electrode 111 is connected with the second gate electrode 121. The adoption of a double-gate transistor can enhance the driving capability, improve the current saturation of the micro light-emitting element, and reduce even prevent the occurrence of leakage current. However, this is not limited in the embodiment.

In some exemplary embodiments, as shown in FIG. 2, a micro light-emitting element may include a light-emitting part 300, a first electrode 301 and a second electrode 302 connected to the light-emitting part 300. The first electrode 301 is connected to a first end of the light-emitting part 300, and the second electrode 302 is connected to a second end of the light-emitting part 300. In some examples, the first electrode 301 of the micro light-emitting element may be an anode and the second electrode 302 may be a cathode. The first electrode 301 may be connected to the first drain electrode 125 of the first transistor T1 through the connection electrode 126, and the second electrode 302 of the micro light-emitting element may be connected to the common electrode line 127. However, this is not limited in the embodiment.

In some exemplary embodiments, as shown in FIG. 2, the first anti-reflection layer and the first conductive layer are integrated. In this example, the first gate electrode 111 is not only used as the gate electrode of the transistor, but also configured to prevent the reflection effect of the remaining conductive layers. In some examples, an orthographic projection of the first anti-reflection layer on the base substrate 101 may include an orthographic projection of the fifth conductive layer on the base substrate 101. The reflectivity of the surface of the first anti-reflection layer facing the base substrate 101 may be smaller than the reflectivity of the surface of the fifth conductive layer facing the base substrate 101, so as to achieve the anti-reflection effect on the side close to the base substrate 101. However, this is not limited in the embodiment. In some examples, the reflectivity of the surface of the first anti-reflection layer facing the base substrate 101 and the reflectivity of the surface facing away from the base substrate 101 may both be smaller than the reflectivity of the surface of the fifth conductive layer facing the base substrate 101, so as to achieve the anti-reflection effect on the side close to the base substrate 101. In some examples, an orthographic projection of the first anti-reflection layer on the base substrate 101 may cover the orthographic projections of the second, third, fourth and fifth conductive layer on the base substrate 101, and the surface reflectivity of the first anti-reflection layer facing the base substrate 101 is not greater than the surface reflectivity of other conductive layers (including the second, third, fourth and fifth conductive layer) facing the base substrate 101, so as to achieve the anti-reflection effect for a plurality of conductive layers, thereby enhancing the display effect.

In some exemplary embodiments, the reflectivity of the material of the first anti-reflection layer is at least less than the reflectivity of the material of the fifth conductive layer for achieving the anti-reflection effect without additional surface treatment process for the first anti-reflection layer, thereby they are implemented easily. However, this is not limited in the embodiment. For example, the orthographic projection of the first anti-reflection layer on the base substrate 101 may cover the orthographic projections of the second, third, fourth and fifth conductive layer on the base substrate 101, and the reflectivity of the first anti-reflection layer is not greater than that of other conductive layers (including the second, third, fourth and fifth conductive layer), so as to achieve the anti-reflection effect of a plurality of conductive layers, thereby improving the display effect.

In some exemplary embodiments, as shown in FIG. 2, a first insulating layer 201 is disposed between the base substrate 10 and the first conductive layer, a second insulating layer 202 is disposed between the first conductive layer and the semiconductor layer, a third insulating layer 203 is disposed between the semiconductor layer and the second conductive layer, a fourth insulating layer 204 is disposed between the second conductive layer and third conductive layer, and a fifth insulating layer 205 is disposed between the third conductive layer and fourth conductive layer. A sixth insulating layer 206 and a seventh insulating layer 207 are disposed between the fourth conductive layer and the fifth conductive layer, and an eighth insulating layer 208 and a ninth insulating layer 209 are disposed between the fifth conductive layer and the second anti-reflection layer 131. In some examples, the first to fifth insulating layer 201 to 205, the seventh insulating layer 207 and the eighth insulating layer 208 may be transparent inorganic insulating layers, and the sixth insulating layer 206 and the ninth insulating layer 209 may be transparent organic insulating layers. However, this is not limited in the embodiment.

In some exemplary embodiments, as shown in FIG. 2, the second anti-reflection layer 131 may be a Black Matrix (BM), which is located on a side of the ninth insulating layer 209 away from the base substrate 101. The orthographic projection of the second anti-reflection layer 131 on the base substrate 101 is partially overlapped with the orthographic projection of the fifth conductive layer on the base substrate 101. The second anti-reflection layer 131 covers part of the fifth conductive layer, which may prevent the reflection effect of the fifth conductive layer. Furthermore, the second anti-reflection layer may prevent light color mixing between adjacent micro light-emitting elements.

In some exemplary embodiments, as shown in FIG. 2, in a direction perpendicular to the display substrate, the light transmittance region 20 includes the base substrate 101, and the first insulating layer 201, the second insulating layer 202, the third insulating layer 203, the fourth insulating layer 204, the fifth insulating layer 205, the seventh insulating layer 207, the eighth insulating layer 208 and a capping layer 400 sequentially disposed on the base substrate 101. The sixth insulating layer 206 and the ninth insulating layer 209 are hollowed out in the light transmittance region 20 to improve the transmittance of the light transmittance region 20. In this example, the orthographic projection of the sixth insulating layer 206 on the base substrate 101 is not overlapped with the light transmittance region 20, and the orthographic projection of the ninth insulating layer 209 on the base substrate 101 is not overlapped with the light transmittance region 20.

A preparation process of the display substrate will be exemplarily described below. The "patterning process" mentioned in the present disclosure includes processes, such as photoresist coating, mask exposure, development, etching and photoresist stripping for metal materials, inorganic materials or transparent conductive materials, and includes organic material coating, mask exposure and development for organic materials. Deposition may be implemented by any one or more of sputtering, evaporation, and chemical vapor deposition, coating may be implemented by any one or more of spray coating, spin coating, and inkjet printing, and etching may be implemented by any one or more of dry etching and wet etching, which is not limited in the present disclosure. "thin film" refers to a layer of thin film made of a certain material on a base substrate by deposition, coating, or other processes. If the patterning process is not needed for the "thin film" in the whole making process, the "thin film" may also be referred to as a "layer". When the patterning process is needed for the "thin film" in the whole making process, the thin film is referred to as a "thin film" before the patterning process and referred to as a "layer" after the patterning process. The "layer" after the patterning process includes at least one "pattern".

In the present disclosure, "A and B are disposed on the same layer" indicates that A and B are simultaneously formed by the same patterning process, and a "thickness" of the thin film layer is the dimension of the thin film layer in a direction perpendicular to the display substrate. In the exemplary embodiment of the present disclosure, "the orthographic projection of A includes the orthographic projection of B" refers to that a boundary of the orthographic projection of B falls within a range of a boundary of the orthographic projection of A or the boundary of the orthographic projection of A is overlapped with the boundary of the orthographic projection of B.

In some exemplary embodiments, the preparation process of the display substrate may include the following operations:

(1) Preparing a First Insulating Layer on the Base Substrate.

In some exemplary embodiments, the base substrate 101 may be a rigid base substrate, such as a glass base substrate or a quartz base substrate, or may be a flexible base substrate, such as an organic resin base substrate. In some examples, the base substrate 101 may be a glass base substrate with a thickness of about 0.5 millimeters (mm). However, this is not limited in the embodiment.

In some exemplary embodiments, a first insulating thin film is deposited on the base substrate 101 to form the first insulating layer 201. As shown in FIG. 2, a first insulating layer 201 is formed in the display region 10 and the light transmittance region 20. The first insulating layer 201 may be referred to as a Buffer layer, which can improve the water and oxygen resistance of the base substrate 101. The first insulating layer 201 may be any one or a combination of silicon nitride (SiNx), silicon oxide (SiOx), and silicon oxynitride (SiON), and may be a single layer, multiple layers, or a composite layer. For example, the first insulating layer 201 may be a stacked structure of SiNx and SiOx (for example, $SiO_2$), wherein the thickness of SiNx is about 500 angstroms and the thickness of SiOx is about 3000 angstroms. However, this is not limited in the embodiment.

(2) Preparing a First Conductive Layer.

In some exemplary embodiments, a first conductive thin film is deposited on the base substrate 101 on which the aforementioned structure are formed, and the first conductive thin film is patterned through a patterning process to form a first conductive layer in the display region 10. As shown in FIG. 2, the first conductive layer at least includes a first gate electrode 111. After this patterning process, the film layer structure of the light transmittance region 20 does not change.

In some exemplary embodiments, the first conductive layer may use a metal material, for example, any one or more of aluminum (Al) and molybdenum (Mo), or an alloy material of the foregoing metals, such as aluminum neodymium alloy (AlNd) or molybdenum-niobium alloy (MoNb), which may be a single-layer structure or a multilayer composite structure, such as Mo/Cu/Mo. In some examples, the material of the first conductive layer may be molybdenum (Mo) with a thickness of about 500 angstroms. However, this is not limited in the embodiment.

In this exemplary embodiment, the first conductive layer further serves as the first anti-reflection layer, which may avoid the reflection effect of a plurality of conductive layers in the display substrate and play a role in preventing reflection, so as to improve the display effect.

(3) Sequentially Preparing a Second Insulating Layer and a Semiconductor Layer.

In some exemplary embodiments, a second insulating thin film and a semiconductor thin film are sequentially deposited on the base substrate 101 on which the aforementioned structure is formed, and the semiconductor thin film is patterned through a patterning process to form the second insulating layer 202 and the semiconductor layer in the display region 10. As shown in FIG. 2, the semiconductor layer at least includes a first active layer 120. The orthographic projection of the first active layer 120 on the base substrate 101 overlaps with the orthographic projection of the first gate electrode 111 on the base substrate 101. After this patterning process, the light transmittance region 20 includes the base substrate 101, and the first insulating layer 201 and the second insulating layer 202 sequentially disposed on the base substrate 101.

In some exemplary embodiments, the second insulating layer 202 may be referred to as a Buffer layer. The second insulating layer 202 may be any one or a combination of silicon nitride (SiNx), silicon oxide (SiOx), and silicon oxynitride (SiON), and may be a single layer, multiple layers, or a composite layer. For example, the material of the second insulating layer 202 may be SiOx, and the thickness is about 1200 angstroms. However, this is not limited in the embodiment.

In some exemplary embodiments, the semiconductor layer may be made of one of more of the materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, embodiments of the present disclosure are applicable to transistors that are manufactured based on oxide technology, silicon technology and organic technology. For example, the material of the semiconductor layer may be polysilicon (p-Si), and the thickness is about 470 angstroms. However, this is not limited in the embodiment.

(4) Sequentially Preparing a Third Insulating Layer and a Second Conductive Layer.

In some exemplary embodiments, a third insulating thin film is deposited on the base substrate 101 with the aforementioned structure formed, and the third insulating thin film is patterned through a patterning process to form a pattern of a third insulating layer 203 covering the semiconductor layer. As shown in FIG. 2, the third insulating layer 203 is provided with a plurality of first through holes V1 in the display region 10, and the second insulating layer 202 and the third insulating layer 203 in the plurality of first through holes are etched away to expose the surface of the first conductive layer.

In some exemplary embodiments, a second conductive thin film is deposited on the base substrate 101 on which the aforementioned structures are formed, and the second conductive thin film is patterned through a patterning process to form a second conductive layer in the display region 10. As shown in FIG. 2, the second conductive layer at least includes a second gate electrode 121 and a first capacitor electrode 122. The orthographic projection of the second gate electrode 121 on the base substrate 101 overlaps with the orthographic projection of the first active layer 120 on the base substrate 101, and the orthographic projection of the second gate electrode 121 on the base substrate 101 overlaps with the orthographic projection of the first gate electrode 111 on the base substrate 101. The second gate electrode 121 may be electrically connected to the first gate electrode 111 through the first through hole V1.

After this patterning process, the light transmittance region 20 includes the base substrate 101, and the first insulating layer 201, the second insulating layer 202, and the third insulating layer 203 sequentially disposed on the base substrate 101.

In some exemplary embodiments, the third insulating layer 203 may be referred to as a Gate Insulator (GI) layer. The third insulating layer 203 may be any one or a combination of silicon nitride (SiNx), silicon oxide (SiOx), and silicon oxynitride (SiON), and may be a single layer, multiple layers, or a composite layer. For example, the material of the third insulating layer 203 may be a stacked structure of SiOx and SiNx, wherein the thickness of SiOx is about 800 angstroms and the thickness of SiNx is about 400 angstroms. However, this is not limited in the embodiment.

In some exemplary embodiments, the second conductive layer may use a metal material, for example, any one or more of aluminum (Al) and molybdenum (Mo), or an alloy material of the foregoing metals, such as aluminum neodymium alloy (AlNd) or molybdenum-niobium alloy (MoNb), which may be a single-layer structure or a multi-layer composite structure, such as Mo/Cu/Mo. In some examples, the material of the second conductive layer may be molybdenum (Mo) with a thickness of about 3100 angstroms. However, this is not limited in the embodiment.

(5) Sequentially Preparing a Fourth Insulating Layer and a Third Conductive Layer.

In some exemplary embodiments, a fourth insulating thin film and a third conductive thin film are sequentially deposited on the base substrate 101 with the foregoing structure formed, and the third conductive thin film is patterned through a patterning process to form the fourth insulating layer 204 and the third conductive layer. As shown in FIG. 2, the third conductive layer is formed in the display region 10 and at least includes a second capacitor electrode 123. The orthographic projection of the second capacitor electrode 123 on the base substrate 101 overlaps with the orthographic projection of the first capacitor electrode 122 on the base substrate 101. After this patterning process, the light transmittance region 20 includes the base substrate 101, and the first insulating layer 201, the second insulating layer 202, the third insulating layer 203, and the fourth insulating layer 204 sequentially disposed on the base substrate 101.

In some exemplary embodiment, the fourth insulating layer 204 may be referred to as a Gate Insulating (GI) layer. The fourth insulating layer 204 may be any one or a combination of silicon nitride (SiNx), silicon oxide (SiOx), and silicon oxynitride (SiON), and may be a single layer, multiple layers, or a composite layer. For example, the material of the fourth insulating layer 204 may be SiNx, and the thickness is about 1400 angstroms. However, this is not limited in the embodiment.

In some exemplary embodiments, the third conductive layer may use a metal material, for example, any one or more of aluminum (Al) and molybdenum (Mo), or an alloy material of the foregoing metals, such as aluminum neodymium alloy (AlNd) or molybdenum-niobium alloy (MoNb), which may be a single-layer structure or a multi-layer composite structure, such as Mo/Cu/Mo. In some examples, the material of the third conductive layer may be molybdenum (Mo) with a thickness of about 3100 angstroms. In this example, the materials of the first conductive layer, the second conductive layer and the third conductive layer may be the same. However, this is not limited in the embodiment.

(6) Sequentially Preparing a Fifth Insulating Layer and a Fourth Conductive Layer.

In some exemplary embodiments, a fifth insulating thin film is deposited on the base substrate 101 with the aforementioned structure formed, and the fifth insulating thin film is patterned through a patterning process to form a fifth insulating layer 205. As shown in FIG. 2, the fifth insulating layer 205 is provided with a plurality of second through holes V2 in the display region 10, and the fifth insulating layer 205, the fourth insulating layer 204 and the third insulating layer 203 in the plurality of second through holes are etched away to expose the surface of the semiconductor layer.

In some exemplary embodiments, a fourth conductive thin film is deposited on the base substrate 101 on which the aforementioned structure is formed, and the fourth conductive thin film is patterned through a patterning process to form a fourth conductive layer in the display region 10. As shown in FIG. 2, the fourth conductive layer at least includes a first source electrode 124 and a first drain electrode 125. The first source electrode 124 is connected to one end of the first active layer 120 through the second through hole V2, and the first drain electrode 125 is connected to the other end of the first active layer 120 through the second through hole.

After this patterning process, the light transmittance region 20 includes the base substrate 101, and the first insulating layer 201, the second insulating layer 202, the third insulating layer 203, the fourth insulating layer 204, and the fifth insulating layer 205 sequentially disposed on the base substrate 101.

In some exemplary embodiment, the fifth insulating layer 205 may be referred to as an interlayer insulating layer. The fifth insulating layer 205 may be any one or a combination of silicon nitride (SiNx), silicon oxide (SiOx), and silicon oxynitride (SiON), and may be a single layer, multiple layers, or a composite layer. For example, the fifth insulating layer 205 may have a stacked structure of SiOx and SiNx, wherein the thickness of SiOx is about 2000 angstroms and the thickness of SiNx is about 3000 angstroms. However, this is not limited in the embodiment.

In some exemplary embodiments, the fourth conductive layer may use a metal material, for example, any one or more of aluminum (Al), molybdenum (Mo) and titanium (Ti), or an alloy material of the foregoing metals, such as aluminum neodymium alloy (AlNd) or molybdenum-niobium alloy (MoNb), which may be a single-layer structure or a multilayer composite structure. In some examples, the fourth conductive layer may have a Ti/Al/Ti multilayer composite structure, wherein the thickness of Ti is about 500 angstroms and the thickness of Al is about 6500 angstroms. However, this is not limited in the embodiment.

At this point, a light emission control circuit is prepared and formed on the base substrate 101. As shown in FIG. 2, in the display region 10, the first active layer 120, the first gate electrode 111, the second gate electrode 121, the first source electrode 124 and the first drain electrode 125 form a first transistor T1, and the first capacitor electrode 122 and the second capacitor electrode 123 form a first capacitor C1.

(7) Preparing a Sixth Insulating Layer.

In some exemplary embodiments, a sixth insulating thin film is coated on the base substrate 101 with the aforementioned structure formed, and the sixth insulating thin film is patterned through a patterning process to form a sixth insulating layer 206 in the display region 10. As shown in FIG. 2, the sixth insulating layer 206 is provided with a plurality of third through holes V3, and the sixth insulating layer 206 in the plurality of third through holes is removed to expose the surface of the fourth conductive layer. After this patterning process, the thin film layer structures of the light transmittance region 20 do not change. In this example, the sixth insulating layer 206 is hollowed out in the light transmittance region 20. The orthographic projection of the sixth insulating layer 206 on the base substrate 101 does not overlap with the light transmittance region 20.

In some exemplary embodiments, the sixth insulating layer 206 is referred to as a Planarization (PLN) Layer. The sixth insulating thin film 206 may be made of an organic insulating material. For example, the sixth insulating layer 206 is made of resin, and the thickness of the sixth insulating layer 206 is about 2 μm. However, this is not limited in the embodiment.

(8) Preparing a Seventh Insulating Layer.

In some exemplary embodiments, a seventh insulating thin film is deposited on the base substrate 101 with the aforementioned structure formed, and the seventh insulating thin film is patterned through a patterning process to form a seventh insulating layer 207. As shown in FIG. 2, the seventh insulating layer 207 is provided with a plurality of fourth through holes V4 and a plurality of first vent holes H1 in the display region 10. The orthographic projection of the fourth through hole V4 on the base substrate 101 is located within the orthographic projection of the third through hole V3 on the base substrate 101. The seventh insulating layer 207 in the fourth through hole V4 is removed, and the fourth through hole V4 is communicated with the third through hole V3, exposing the surface of the fourth conductive layer. The seventh insulating layer 207 in the first vent hole H1 is etched away, exposing the surface of the sixth insulating layer 206. In the preparation process of the seventh insulating layer 207, the sixth insulating layer 206 easily releases a large amount of outgas under high temperature, and these gases may be exhausted through the first vent holes H1 to prevent the seventh insulating layer 207 from bursting.

After this patterning process, the light transmittance region 20 includes the base substrate 101, and the first insulating layer 201, the second insulating layer 202, the third insulating layer 203, the fourth insulating layer 204, the fifth insulating layer 205 and the seventh insulating layer 207 sequentially disposed on the base substrate 101.

In some exemplary embodiments, the seventh insulating layer 207 is referred to as a Passivation (PVX) Layer. The seventh insulating layer 207 may be any one or a combination of silicon nitride (SiNx), silicon oxide (SiOx), and silicon oxynitride (SiON), and may be a single layer, multiple layers, or a composite layer. For example, the material of the seventh insulating layer 207 may be SiNx, and the thickness is about 2000 angstroms. However, this is not limited in the embodiment.

(9) Preparing a Fifth Conductive Layer.

In some exemplary embodiments, a fifth conductive layer is formed in the display region 10 by electroplating additive process on the base substrate 101 with the aforementioned structures formed. As shown in FIG. 2, the fifth conductive layer at least includes a connection electrode 126, a common electrode line 127, and a signal line 128 (for example, a power supply line VDD). The connection electrode 126 is connected to the first drain electrode 125 of the first transistor T1 through the fourth through hole V4. After this process, the thin film layer structures of the light transmittance region 20 do not change.

In some exemplary embodiments, the material of the fifth conductive layer may be a metal material, such as copper (Cu), and the thickness is about 10 μm. However, this is not limited in the embodiment.

(10) Preparing an Eighth Insulating Layer.

In some exemplary embodiments, an eighth insulating thin film is deposited on the base substrate 101 with the aforementioned structure formed, and the eighth insulating thin film is patterned through a patterning process to form an eighth insulating layer 208. As shown in FIG. 2, the eighth insulating layer 208 is provided with a plurality of second vent holes H2 in the display region 10. The eighth insulating layer 208 in the second vent holes H2, which is communicates with the first vent hole H1, is etched away, exposing the surface of the sixth insulating layer 206. In the preparation process of the eighth insulating layer 208, the sixth insulating layer 206 easily releases a large amount of outgas under high temperature, which may be exhausted through the first vent holes H1 and the second vent holes H2 to prevent the seventh insulating layer 207 and the eighth insulating layer 208 from bursting.

After this patterning process, the light transmittance region 20 includes the base substrate 101, and the first insulating layer 201, the second insulating layer 202, the third insulating layer 203, the fourth insulating layer 204, the fifth insulating layer 205, the seventh insulating layer 207 and the eighth insulating layer 208 sequentially disposed on the base substrate 101.

In some exemplary embodiments, the eighth insulating layer 208 is referred to as a passivation layer. The eighth insulating layer 208 may be any one or a combination of silicon nitride (SiNx), silicon oxide (SiOx), and silicon oxynitride (SiON), and may be a single layer, multiple layers, or a composite layer. For example, the material of the eighth insulating layer 208 may be SiNx, and the thickness is about 2000 angstroms. However, this is not limited in the embodiment.

(11) Preparing a Ninth Insulating Layer.

In some exemplary embodiments, a ninth insulating thin film is coated on the base substrate 101 with the aforementioned structure formed, and the ninth insulating thin film is patterned through a patterning process to form a ninth insulating layer 209 in the display region 10. As shown in FIG. 2, the ninth insulating layer 209 is provided with a plurality of fifth through holes V5. The ninth insulating layer 209 in the plurality of fifth through holes is removed to expose the surface of the eighth insulating layer 208. After this patterning process, the thin film layer structures of the light transmittance region 20 do not change. In this example, the ninth insulating layer 209 is hollowed out in the light transmittance region 20. The orthographic projection of the ninth insulating layer 209 on the base substrate 101 does not overlap with the light transmittance region 20.

In some exemplary embodiments, the ninth insulating layer 209 is referred to as a planarization layer. The ninth insulating thin film 209 may be made of an organic insulating material. For example, the ninth insulating layer 209 may be made of a resin material, and its thickness may be greater than or equal to 2 μm. The thickness of the ninth insulating layer 209 may be determined according to the thickness of the fifth conductive layer, the height of the micro light-emitting element, and the like. However, this is not limited in the embodiment.

(12) Preparing a Second Anti-Reflection Layer.

In some exemplary embodiments, a black pigment is coated or a black chromium (Cr) thin film is deposited on the base substrate 101 with the aforementioned structure formed, and the black pigment or the black chromium thin film is patterned through a patterning process to form the second anti-reflection layer 131. In this example, the second anti-reflection layer 131 may be referred to as a black matrix. The black matrix may absorb the light rays of the micro light-emitting elements towards the side close to the base substrate 101 (for example, including vertically downward and obliquely downward light rays), which may prevent the light rays from influencing the performance of the transistor and prevent the light crosstalk between adjacent micro light-emitting elements. In this exemplary embodiment, the reflection effect of a plurality of conductive layers may be avoided by providing the second anti-reflection layer, so as to improve the display effect.

After this patterning process, the film layer structure of the light transmittance region 20 does not change.

(13) Preparing a Sixth Through Hole.

In some exemplary embodiments, the eighth insulating layer 208 is etched on the base substrate 101 with the aforementioned structure formed, and a plurality of sixth through holes are formed on the eighth insulating layer 208 in the display region 10. The orthographic projection of the sixth through hole on the base substrate 101 is located within the orthographic projection of the fifth through hole of the ninth insulating layer 209 on the base substrate 101. The sixth through hole is communicated with the fifth through hole, and the eighth insulating layer 208 in the sixth through hole is etched away to expose the surface of the fifth conductive layer.

After this process, the film layer structure of the light transmittance region 20 does not change.

(14) Transferring Printing the Micro Light-Emitting Elements.

In some exemplary embodiments, the micro light-emitting element may be a Micro-LED. The micro light-emitting element includes a first electrode 301, a second electrode 302 and a light-emitting part 300. The first electrode 301 is connected to a first end of the light-emitting part 300, and the second electrode 302 is connected to a second end of the light-emitting part 300. In some examples, the first electrode 301 may be an anode and the second electrode 302 may be a cathode. However, this is not limited in the embodiment. In some examples, a dispenser is used in a vacuum environment to add bonding materials (such as solder paste) to the fifth through hole and the sixth through hole, and the transfer process is used to complete the bonding of the micro light-emitting element. The first electrode 301 of the micro light-emitting element is bonded and connected to the connection electrode 126 through the bonding material in the fifth through hole and the sixth through hole. The second electrode 302 is bonded and connected to the common electrode line 127 through the bonding material in the fifth through hole and the sixth through hole. In this way, the first electrode 301 of the micro light-emitting element is connected to the first drain electrode 125 of the first transistor T1 through the connection electrode 126, and the second electrode 302 is connected to the common electrode line 127.

After this process, the film layer structure of the light transmittance region 20 does not change.

(15) Preparing a Capping Layer on the Base Substrate.

In some exemplary embodiments, a capping thin film is coated on the base substrate 10 with the aforementioned structure to form a capping layer 400. As shown in FIG. 2, the capping layer 400 may cover the display region 10 and the light transmittance region 20. After this process, the light transmittance region 20 includes the base substrate 101, and the first insulating layer 201, the second insulating layer 202, the third insulating layer 203, the fourth insulating layer 204, the fifth insulating layer 205, the seventh insulating layer 207, the eighth insulating layer 208 and the capping layer 400 sequentially disposed on the base substrate 101.

In some examples, the absolute value of the difference between the refractive index of the capping layer 400 and the refractive index of the base substrate 101 may be less than 0.1, for example. For example, the refractive index of the capping layer 400 is approximately equal to the refractive index of the base substrate 101 to reduce the transmittance loss. The thickness of the capping layer 400 in the light transmittance region 20 may be different from the thickness of the capping layer 400 in the display region 10. The thickness of the capping layer 400 may be determined according to the thickness of the fifth conductive layer, the height of the micro light-emitting element, and the like. For example, the distance between the side surface of the capping layer 400 away from the base substrate 101 and the side surface of the micro-light-emitting element away from the base substrate 101 may be greater than or equal to 2 μm. However, this is not limited in the embodiment.

In this exemplary embodiment, providing the capping layer 400 can encapsulate and protect the micro light-emitting element without reducing the light transmittance of the light emitted by the micro light-emitting element.

In some exemplary embodiments, taking the aperture ratio of the display substrate as about 87.8% as an example, the film layer transmittance of the display substrate prepared according to the above preparation process is about 78.6%, and the transmittance of the display substrate is about 69.01%. In this example, the opening region of the display substrate is a region not covered by the black matrix, and the aperture ratio indicates the area ratio of the opening region.

A structure and a preparation process of a display substrate shown in the exemplary embodiments are merely illustrative. In some exemplary embodiment, according to actual needs, corresponding structures may be changed and patterning processes may be added or reduced. For example, the first anti-reflection layer may be located on one side of the first conductive layer near the base substrate. As another example, the transistor in the display region may have a single gate structure. As another example, the common electrode line may be located on the fourth conductive layer and connected to the second electrode of the micro light-emitting element through the connection electrode. However, this is not limited in the embodiment.

According to the display substrate of this exemplary embodiment, the light transmittance and the display effect may be improved through the film layer design of the light transmittance region. In addition, the preparation process according to the embodiments of the present disclosure may be achieved by using the existing mature preparation equipment, has little change on the existing process, may be well compatible with the existing preparation process, and has advantages of simple process, easy implementation, high production efficiency, low production cost and high yield rate.

A structure (or method) shown in the embodiments may be appropriately combined with a structure (or method) shown in other embodiments.

In some exemplary embodiments, it may be seen from Table 1 that among the materials used for the above-mentioned plurality of insulating layers, the refractive index of SiNx is relatively large, while the refractive indices of other materials are close to each other. If the refractive index of the first medium is n1, the refractive index of the second medium is n2, and a reflectivity of light from the first medium to the second medium will be $\{(n2-n1)/(n2+n1)\}^2$. Therefore, the direct contact interface between SiNx and SiOx has a great influence on the transmittance.

TABLE 1

Refractive Index of Different Materials

| film Layer | Refractive Index |
| --- | --- |
| Capping Layer | 1.47 |
| Planarization Layer | 1.52 |
| SiOx | 1.5 to 1.6 |
| SiNx | 1.8 to 2.0 |
| Glass | 1.52 |

In some exemplary embodiments, based on the display substrate shown in FIG. 2, the material of the first insulating layer 201 may be SiOx, and the thickness is about 3000 angstroms. The material of the fifth insulating layer 205 may be SiNx, and the thickness is about 3000 angstroms. The structure and materials of other thin film layers may refer to the description of the previous embodiment, so they will not be repeated here. In this exemplary embodiment, compared with the previous embodiment, the influence of twice refractive index mismatch caused by SiOx and SiNx is eliminated. In some examples, taking the aperture ratio of the display substrate is about 87.8% as an example, the film layer transmittance of the display substrate of this exemplary embodiment is about 87.31%, and the transmittance of the display substrate is about 76.66%. The display substrate of this exemplary embodiment may improve transmittance.

For related structure of the display substrate of the present embodiment, reference may be made to the description of the above embodiment, so it will not be repeated here. A structure (or method) shown in the embodiments may be appropriately combined with a structure (or method) shown in other embodiments.

Figure 3:
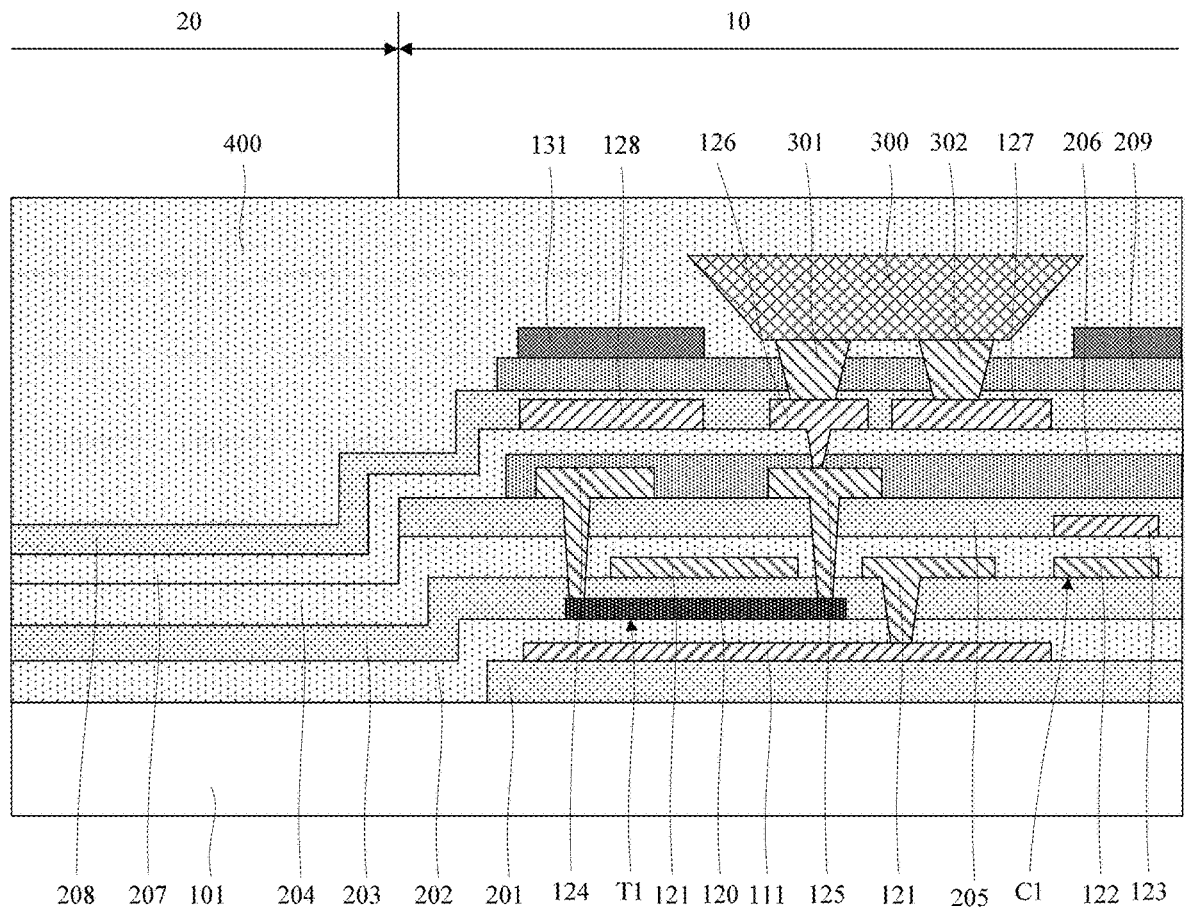
FIG. 3 is schematic diagram of another structure of a display substrate according to at least one embodiment of the present disclosure.

FIG. 3 is schematic diagram of another structure of a display substrate according to at least one embodiment of the present disclosure. In some exemplary embodiments, as shown in FIG. 3, in a direction perpendicular to the display substrate, the light transmittance region 20 includes the base substrate 101, and the second insulating layer 202, the third insulating layer 203, the fourth insulating layer 204, the seventh insulating layer 207, the eighth insulating layer 208 and a capping layer 400 sequentially disposed on the base substrate 101. In this example, the first insulating layer 201, the fifth insulating layer 205, the sixth insulating layer 206, and the ninth insulating layer 209 are hollowed out in the light transmittance region 20.

In some exemplary embodiments, when the material of the first insulating layer is SiOx and the material of the fifth insulating layer is SiNx, there are the following problems: the first insulating layer without SiNx cannot effectively prevent the influence of Na and K ion diffusion on the Excimer Laser Annealing (ELA) crystal in the glass base substrate 101, and further deteriorate the characteristics of Thin Film Transistor (TFT). The absence of SiOx in the fifth insulating layer will affect the characteristics of TFT, resulting in the Positive Bias of Thermal Stability (PBTS). In view of the above situation, in this exemplary embodiment, the first insulating layer 201 may have a stacked structure of SiNx and SiOx, and the fifth insulating layer 205 may have a stacked structure of SiOx and SiNx, and the first insulating layer 201 and the fifth insulating layer 205 are hollowed out in the light transmittance region 20. In this way, it is possible to prevent the first insulating layer 201 and the fifth insulating layer 205 from affecting the characteristics of the TFT due to materials, thus improving the transmittance of the light transmittance region 20.

In some exemplary embodiments, during the preparation process of the display substrate of this embodiment, after the first insulating thin film is deposited on the base substrate 101, the first insulating thin film is patterned through a patterning process to form the first insulating layer 201. As shown in FIG. 3, the first insulating layer 201 is hollowed out in the light transmittance region 20. Before forming the sixth insulating layer 206, the fifth insulating layer 205 is etched to remove the fifth insulating layer 205 in the light transmittance region 20, so that the fifth insulating layer 205 is hollowed out in the light transmittance region 20. However, this is not limited in the embodiment.

As to the rest of the structure and the preparation process of the display substrate in this embodiment, reference may be made to the description of the embodiment shown in FIG. 2, which hence will not be repeated here. A structure (or method) shown in the embodiments may be appropriately combined with a structure (or method) shown in other embodiments.

Figure 4:
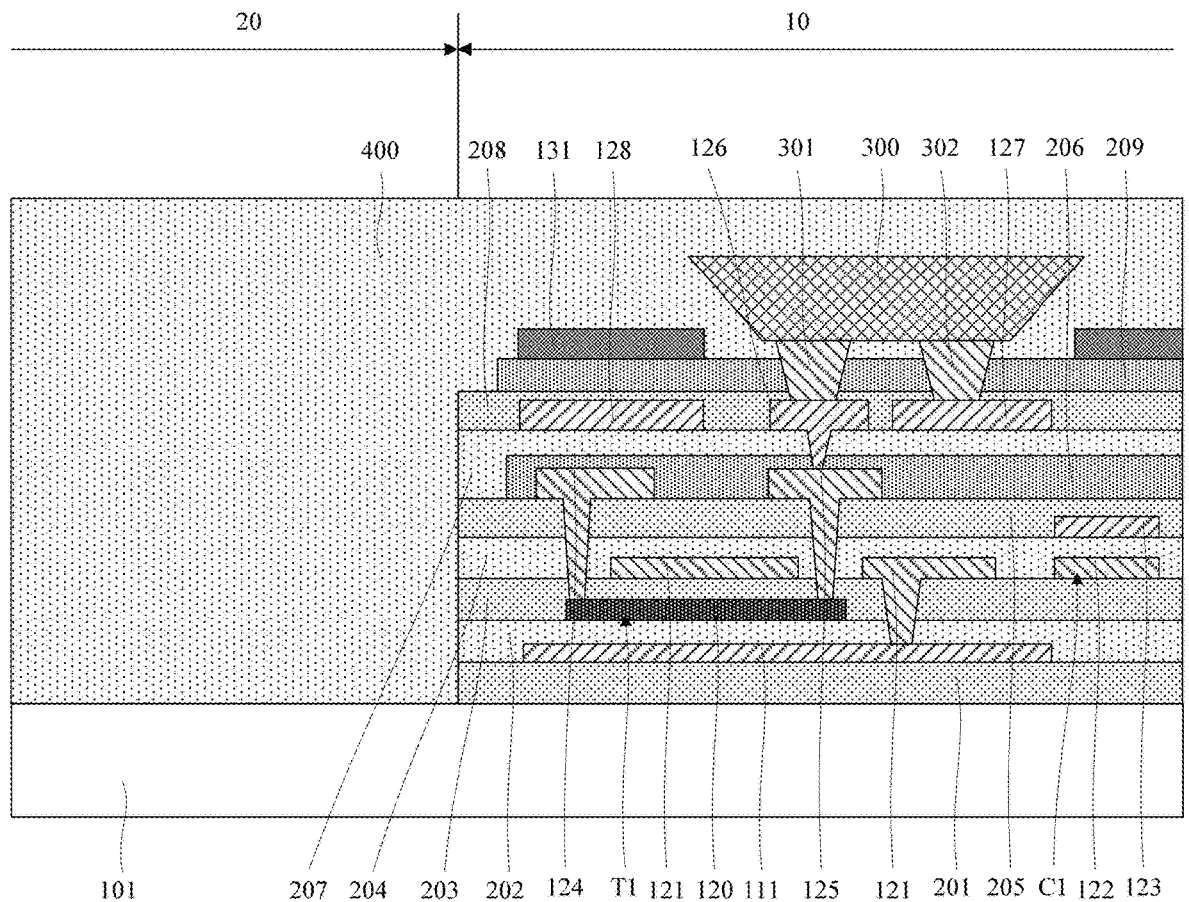
FIG. 4 is schematic diagram of another structure of a display substrate according to at in least one embodiment of the present disclosure.

FIG. 4 is schematic diagram of another structure of a display substrate according to at least one embodiment of the present disclosure. In some exemplary embodiments, as shown in FIG. 4, in a plane perpendicular to the display substrate, the light transmittance region 20 includes a base substrate 101 and a capping layer 400 provided on the base substrate 101. The first insulating layer 201 to the ninth insulating layer 209 are hollowed out in the light transmittance region 20. For the structure of the display region of the display substrate of this exemplary embodiment, reference may be made to the description of the embodiment shown in FIG. 2, so it will not be repeated here.

In some exemplary embodiments, in the preparation process of the display substrate of this embodiment, after the eighth insulating layer 208 is formed, all inorganic insulating layers (including the first insulating layer 201 to the fifth insulating layer 205, the seventh insulating layer 207 and the eighth insulating layer 208) of the light transmittance region 20 are removed by one etching process. Or, after the ninth insulating layer 209 is formed, all inorganic insulating layers (including the first insulating layer 201 to the fifth insulating layer 205, the seventh insulating layer 207 and the eighth insulating layer 208) of the light transmittance region 20 are removed by one etching process. Or, after the second anti-reflection layer 131 is formed, all inorganic insulating layers (including the first insulating layer 201 to the fifth insulating layer 205, the seventh insulating layer 207 and the eighth insulating layer 208) of the light transmittance region 20 are removed by one etching process. However, this is not limited in the embodiment.

In some exemplary embodiments, taking the aperture ratio of the display substrate is about 87.8% as an example, the film layer transmittance of the display substrate of this exemplary embodiment is about 93.30%, and the transmittance of the display substrate is about 81.92%. The display substrate of this exemplary embodiment may improve transmittance.

As to the rest of the structure and the preparation process of the display substrate in this embodiment, reference may be made to the description of the embodiment shown in FIG. 2, which hence will not be repeated here. A structure (or method) shown in the embodiments may be appropriately combined with a structure (or method) shown in other embodiments.

Figure 5:
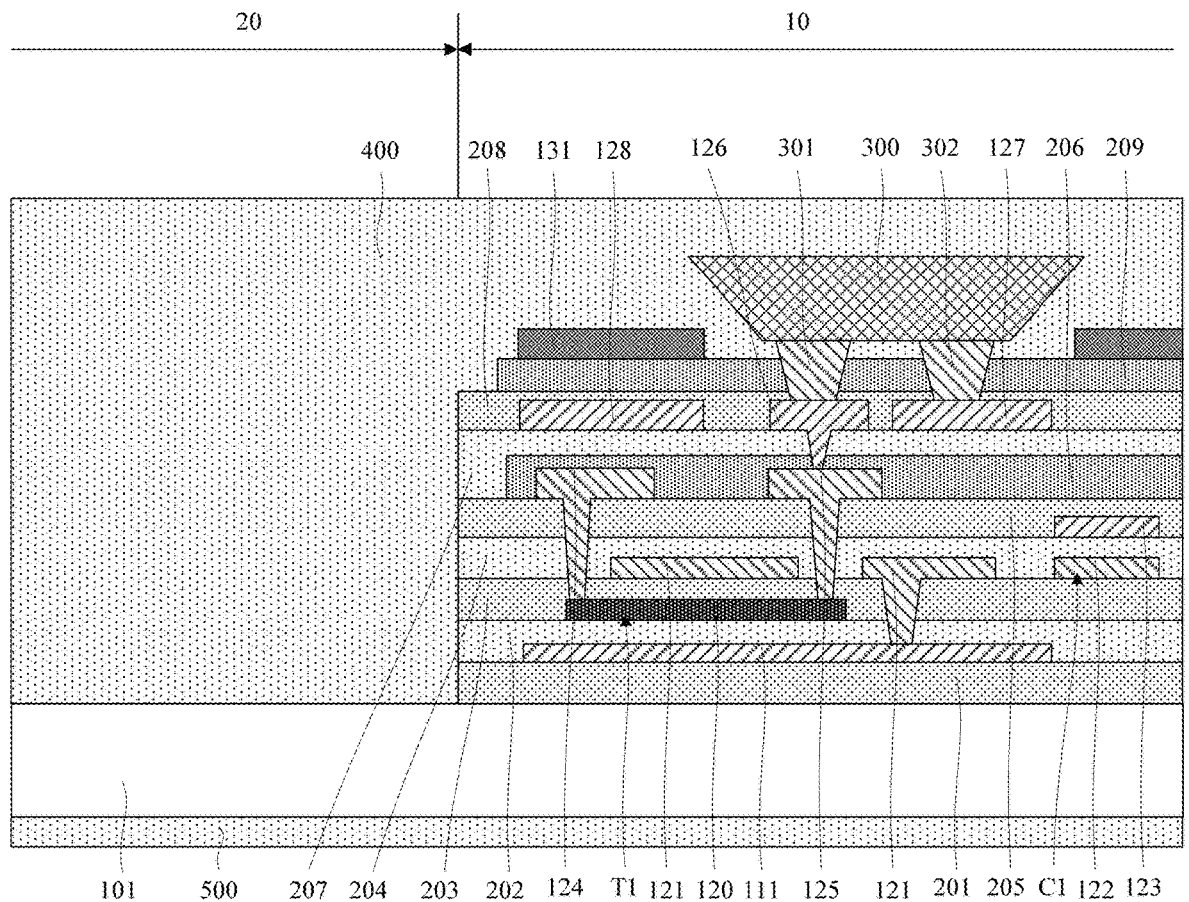
FIG. 5 is schematic diagram of another structure of a display substrate according to at least one embodiment of the present disclosure.

FIG. 5 is schematic diagram of another structure of a display substrate according to at least one embodiment of the present disclosure. In some exemplary embodiments, as shown in FIG. 5, in a plane perpendicular to the display substrate, the light transmittance region 20 includes a base substrate 101, a capping layer 400 disposed on the base substrate 101, and an anti-reflective layer 500 disposed on the side of the base substrate 101 away from the capping layer 400. The anti-reflective layer 500 is located on the side of the base substrate 101 away from the sub-pixels. The orthographic projection of the anti-reflective layer 500 on the base substrate 101 covers the light transmittance region 20 and the display region 10. In some examples, the material of the anti-reflective layer 500 may be SiOx, for example, $SiO_2$, and the thickness of the anti-reflective layer 500 may be greater than or equal to 2000 angstroms. However, this is not limited in the embodiment.

In this exemplary embodiment, the transmittance may be further improved by providing the anti-reflective layer 500 on the back of the base substrate 101.

As to the rest of the structure and the preparation process of the display substrate in this embodiment, reference may be made to the description of the embodiment shown in FIG. 4, which hence will not be repeated here. A structure (or method) shown in the embodiments may be appropriately combined with a structure (or method) shown in other embodiments.

Figure 6:
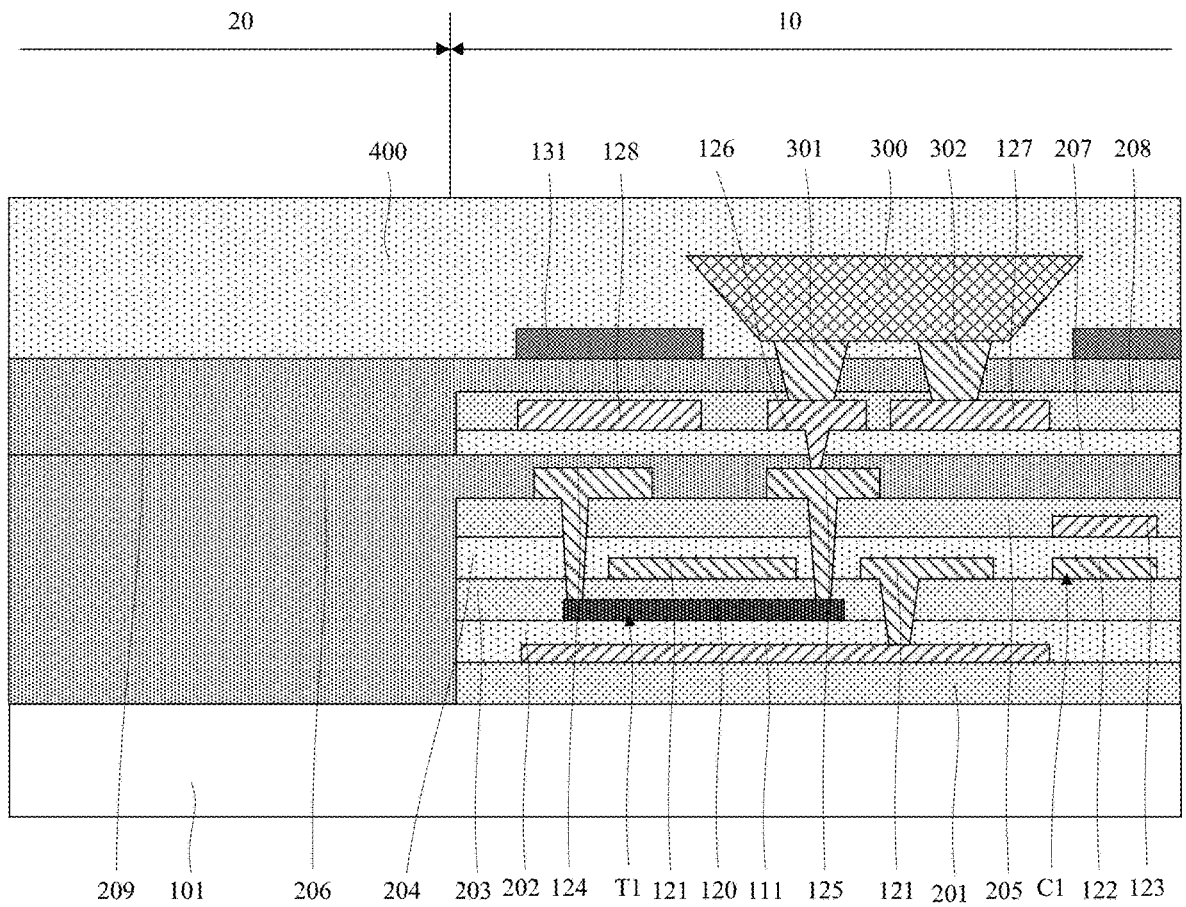
FIG. 6 is schematic diagram of another structure of a display substrate according to at least one embodiment of the present disclosure.

FIG. 6 is schematic diagram of another structure of a display substrate according to at least one embodiment of the present disclosure. In some exemplary embodiments, as shown in FIG. 6, in a plane perpendicular to the display substrate, the light transmittance region 20 includes a base substrate 101, a sixth insulating layer 206, a ninth insulating layer 209 and a capping layer 400 sequentially disposed on the base substrate 101. In this example, the first insulating layer 201 to the fifth insulating layer 205, the seventh insulating layer 207 and the eighth insulating layer 208 are hollowed out in the light transmittance region 20.

In this exemplary embodiment, providing the sixth insulating layer 206 and the ninth insulating layer 209 in the light transmittance region 20 can avoid the risk of etching residue caused by the influence of high step difference after all inorganic insulating layers are etched away, thereby ensuring the transmittance of the light transmitting region.

In some exemplary embodiments, in the preparation process of the display substrate of this exemplary embodiment, after the fifth insulating layer 205 is formed, all inorganic insulating layers (including the first insulating layer 201 to the fifth insulating layer 205) of the light transmittance region 20 are removed by one etching process, that is, by step by step etching, second through holes are formed in the fifth insulating layer 205 of the display region 10, and the inorganic insulating layers of the light transmittance region 20 are hollowed out in proper order. Or, in the process of forming the fifth insulating layer 205, by one etching process, a second through hole is formed in the fifth insulating layer 205 of the display region 10, and all the inorganic insulating layers of the light transmittance region 20 are hollowed out. In the process of forming the sixth insulating layer 206, the sixth insulating layer 206 covers the display region 10 and the light transmittance region 20 to avoid forming high step difference in the light transmittance region 20. In the process of forming the eighth insulating layer 208, a fifth through hole is formed in the eighth insulating layer 208 of the display region 10, and then the seventh insulating layer 207 and the eighth insulating layer 208 of the light transmittance region 20 are removed by one etching process. Or, in the formation process of the eighth insulating layer 208, by one etching process, a fifth through hole is formed in the eighth insulating layer 208 of the display region 10, and the seventh insulating layer 207 and the eighth insulating layer 208 of the light transmittance region 20 are entirely hollowed out. In the process of forming the ninth insulating layer 209, the ninth insulating layer 209 covers the display region 10 and the light transmittance region 20 to avoid forming high step difference in the light transmittance region 20. However, this is not limited in the embodiment.

As to the rest of the structure and the preparation process of the display substrate in this embodiment, reference may be made to the description of the embodiment shown in FIG. 2, which hence will not be repeated here. A structure (or method) shown in the embodiments may be appropriately combined with a structure (or method) shown in other embodiments.

At least one embodiment of the present disclosure provides a method for preparing a display substrate, which is used for preparing the display substrate as described above. The preparation method includes forming a plurality of sub-pixels on a base substrate. At least one sub-pixel includes a light transmittance region and a display region. The display region includes a circuit structure layer and a light-emitting element which are disposed on a base substrate, and the light-emitting element is connected with the circuit structure layer; the display region is further provided with a plurality of insulating layers, and at least one insulating layer is hollowed out in the light transmittance region.

In some exemplary embodiments, forming a plurality of sub-pixels on the base substrate includes sequentially forming a first insulating layer, a first conductive layer, a second insulating layer, a semiconductor layer, a third insulating layer, a second conductive layer, a fourth insulating layer, a third conductive layer, a fifth insulating layer, a fourth conductive layer, a sixth insulating layer, a seventh insulating layer, a fifth conductive layer, an eight insulating layer and a ninth insulating layer on the base substrate, wherein, the semiconductor layer, the first conductive layer, the second conductive layer, the third conductive layer, the fourth conductive layer and the fifth conductive layer are located in the display region. The sixth insulating layer and the ninth insulating layer are hollowed out in the light transmittance region.

In some exemplary embodiments, forming a plurality of sub-pixels on the base substrate further includes removing the first insulating layer of the light transmittance region before forming the second insulating layer; and removing the fifth insulating layer of the light transmittance region before forming the sixth insulating layer.

In some exemplary embodiments, forming a plurality of sub-pixels on the base substrate further includes removing the first insulating layer to fifth insulating layer, the seventh insulating layer and the eighth insulating layer in the light transmittance region after forming the eighth insulating layer or after forming the ninth insulating layer.

In some exemplary embodiments, forming a plurality of sub-pixels on the base substrate includes sequentially forming a first insulating layer, a first conductive layer, a second insulating layer, a semiconductor layer, a third insulating layer, a second conductive layer, a fourth insulating layer, a third conductive layer, a fifth insulating layer, a fourth conductive layer, a sixth insulating layer, a seventh insulating layer, a fifth conductive layer, an eight insulating layer and a ninth insulating layer on the base substrate, wherein, the semiconductor layer, the first conductive layer, the second conductive layer, the third conductive layer, the fourth conductive layer and the fifth conductive layer are located in the display region. The first to fifth insulating layer of the light transmittance region are removed before forming the sixth insulating layer, and the seventh and eighth insulating layers of the light transmittance region are removed before forming the ninth insulating layer.

Preparation method of this embodiment may refer to the descriptions of the aforementioned embodiments and will not be illustrated repeatedly here.

Figure 7:
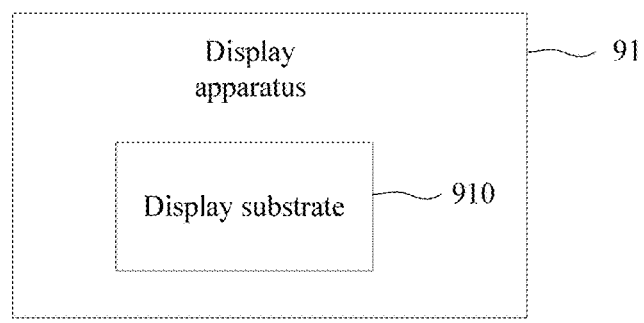
FIG. 7 is a schematic diagram of a display apparatus according to at least one embodiment of the present disclosure.

FIG. 7 is a schematic diagram of a display apparatus according to at least one embodiment of the present disclosure. As shown in FIG. 7, the embodiment provides a display apparatus 91, which includes a display substrate 910. The display substrate 910 is a display substrate provided in the foregoing embodiments. The display substrate 910 may be a micro-LED display substrate or a mini-LED display substrate. The display device 91 may be any product or component with transparent display function, such as window glass, display windows in shopping malls, Augmented Reality (AR) devices, Virtual Reality (VR) devices, etc. However, this is not limited in the embodiment.

The drawings of the embodiments of the present disclosure only involve the structures involved in the embodiments of the present disclosure, and the other structures may refer to conventional designs. The embodiments of the present disclosure and features in the embodiments may be combined with each other to obtain a new embodiment if there is no conflict.

Those of ordinary skills in the art should understand that modifications or equivalent substitutions may be made to the technical solutions of the present disclosure without departing from the spirit and scope of the technical solutions of the present disclosure, all of which should be included within the scope of the claims of the present disclosure.

What is claimed is:

1. A display substrate, comprising:
    a base substrate, a plurality of sub-pixels disposed on the base substrate and a capping layer disposed on the base substrate,
    wherein at least one sub-pixel comprises a light transmittance region and a display region, wherein the display region comprises a circuit structure layer and a light-emitting element which are disposed on the base substrate; the light-emitting element is connected with the circuit structure layer;
    wherein the display substrate further comprises a plurality of insulating layers disposed on the base substrate, wherein at least one insulating layer is hollowed out in the light transmittance region;
    wherein the capping layer covers the light transmittance region and the display region continuously;
    wherein the display region further comprises: a first anti-reflection layer located on a side of the circuit structure layer close to the base substrate and a second anti-reflection layer located on a side of the circuit structure layer away from the base substrate;
    wherein the circuit structure layer comprises a first conductive layer, a semiconductor layer, a second conductive layer, a third conductive layer, a fourth conductive layer and a fifth conductive layer disposed on the base substrate;
    wherein the plurality of insulating layers comprise: a first insulating layer between the base substrate and the first conductive layer, a second insulating layer between the first conductive layer and the semiconductor layer, a third insulating layer between the semiconductor layer and the second conductive layer, a fourth insulating layer between the second conductive layer and the third conductive layer, a fifth insulating layer between the third conductive layer and the fourth conductive layer, a sixth insulating layer and a seventh insulating layer between the fourth conductive layer and the fifth conductive layer, and an eighth insulating layer and a ninth insulating layer located between the fifth conductive layer and the second anti-reflection layer; and
    wherein the first insulating layer to fifth insulating layer, the seventh insulating layer and the eighth insulating layer are inorganic insulating layers, and the sixth insulating layer and the ninth insulating layer are organic insulating layers.

2. The display substrate of claim 1, wherein the light transmittance region is provided with a plurality of insulating layers, and an absolute value of a refractive index difference between adjacent insulating layers in the plurality of insulating layers is less than or equal to 0.5.

3. The display substrate of claim 1, wherein the first anti-reflection layer is integrated with the first conductive layer.

4. The display substrate of claim 1, wherein an orthographic projection of the first anti-reflection layer on the base substrate at least comprises an orthographic projection of the fifth conductive layer on the base substrate.

5. The display substrate of claim 1, wherein a reflectivity of a surface of the first anti-reflection layer facing the base substrate is lower than a reflectivity of a surface of the fifth conductive layer facing the base substrate.

6. The display substrate of claim 5, wherein a reflectivity of a material of the first anti-reflection layer is smaller than a reflectivity of a material of the fifth conductive layer.

7. The display substrate of claim 1, wherein an orthographic projection of the second anti-reflection layer on the base substrate comprises an region in the display region outside an overlapping region of the light-emitting element and the fifth conductive layer on the base substrate.

8. The display substrate of claim 1, wherein the first insulating layer has a stacked structure of $SiN_x$ and $SiO_x$, the second insulating layer is made of $SiO_x$, the third insulating layer has a stacked structure of $SiO_x$ and $SiN_x$, the fourth insulating layer is made of $SiN_x$, the fifth insulating layer has a stacked structure of SiOx and SiNx, and the seventh insulating layer and the eighth insulating layer are made of SiNx; or the first insulating layer is made of SiOx, the second insulating layer is made of SiOx, the third insulating layer has a stacked structure of SiOx and SiNx, the fourth insulating layer is made of SiNx, the fifth insulating layer is made of SiNx, and the seventh insulating layer and the eighth insulating layer are made of SiNx.

9. The display substrate of claim 1, wherein the first insulating layer and the fifth insulating layer are hollowed out in the light transmittance region; or, the first insulating layer to the ninth insulating layer are hollowed out in the light transmittance region; or, the sixth insulating layer and the ninth insulating layer are hollowed out in the light transmittance region; or, the sixth insulating layer and the ninth insulating layer of the plurality of insulating layers are disposed in the light transmittance region.

10. The display substrate of claim 1, further comprising: a third anti-reflective layer located on one side of the base substrate away from the sub-pixel; an orthographic projection of the third anti-reflective layer on the base substrate covers the light transmittance region and the display region.

11. A display apparatus, comprising a display substrate, wherein the display substrate comprises:

a base substrate, a plurality of sub-pixels disposed on the base substrate and a capping layer disposed on the base substrate, wherein at least one sub-pixel comprises a light transmittance region and a display region; the display region comprises a circuit structure layer and a light-emitting element which are disposed on the base substrate; the light-emitting element is connected with the circuit structure layer;

wherein the display substrate further comprises a plurality of insulating layers disposed on the base substrate, wherein at least one insulating layer is hollowed out in the light transmittance region;

wherein the capping layer covers the light transmittance region and the display region continuously;

wherein the display region further comprises: a first anti-reflection layer located on a side of the circuit structure layer close to the base substrate and a second anti-reflection layer located on a side of the circuit structure layer away from the base substrate;

wherein the circuit structure layer comprises a first conductive layer, a semiconductor layer, a second conductive layer, a third conductive layer, a fourth conductive layer and a fifth conductive layer disposed on the base substrate;

wherein the plurality of insulating layers comprise: a first insulating layer between the base substrate and the first conductive layer, a second insulating layer between the first conductive layer and the semiconductor layer, a third insulating layer between the semiconductor layer and the second conductive layer, a fourth insulating layer between the second conductive layer and the third conductive layer, a fifth insulating layer between the third conductive layer and the fourth conductive layer, a sixth insulating layer and a seventh insulating layer between the fourth conductive layer and the fifth conductive layer, and an eighth insulating layer and a ninth insulating layer located between the fifth conductive layer and the second anti-reflection layer; and wherein the first insulating layer to fifth insulating layer, the seventh insulating layer and the eighth insulating layer are inorganic insulating layers, and the sixth insulating layer and the ninth insulating layer are organic insulating layers.

12. A preparation method for a display substrate, which is used for preparing the display substrate of claim 1, the method comprises:

forming a plurality of sub-pixels on a base substrate, wherein at least one sub-pixel comprises a light transmittance region and a display region; the display region comprises a circuit structure layer and a light-emitting element which are disposed on the base substrate, and the light-emitting element is connected with the circuit structure layer; the display region is further provided with a plurality of insulating layers, and at least one insulating layer is hollowed out in the light transmittance region;

wherein forming the plurality of sub-pixels on the base substrate comprises:

sequentially forming the first insulating layer, the first conductive layer, the second insulating layer, the semiconductor layer, the third insulating layer, the second conductive layer, the fourth insulating layer, the third conductive layer, the fifth insulating layer, the fourth conductive layer, the sixth insulating layer, the seventh insulating layer, the fifth conductive layer, the eighth insulating layer and the ninth insulating layer on the base substrate, wherein the semiconductor layer, the first conductive layer, the second conductive layer, the third conductive layer, the fourth conductive layer and the fifth conductive layer are located in the display region, and the sixth insulating layer and the ninth insulating layer are hollowed out in the light transmittance region.

13. The preparation method of claim 12, wherein forming the plurality of sub-pixels on the base substrate further comprises:

removing the first insulating layer of the light transmittance region before forming the second insulating layer; and removing the fifth insulating layer of the light transmittance region before forming the sixth insulating layer.

14. The preparation method of claim 12, wherein forming the plurality of sub-pixels on the base substrate further comprises:

removing the first insulating layer to fifth insulating layer, the seventh insulating layer and the eighth insulating layer in the light transmittance region after forming the eighth insulating layer or after forming the ninth insulating layer.

* * * * *